United States Patent [19]
Surridge

[11] Patent Number: 5,894,166
[45] Date of Patent: Apr. 13, 1999

US005894166A

[54] CHIP MOUNTING SCHEME

[75] Inventor: Robert Surridge, Kanata, Canada

[73] Assignee: Northern Telecom Limited, Montreal, Canada

[21] Appl. No.: 08/932,709

[22] Filed: Sep. 17, 1997

[51] Int. Cl.$^6$ .......................... H01L 23/495; H01L 23/06; H01L 23/10
[52] U.S. Cl. .......................... 257/675; 257/705; 257/706; 257/780
[58] Field of Search .................... 257/675, 705, 257/700, 780, 796, 783, 737, 706

[56] References Cited

U.S. PATENT DOCUMENTS

| | | | |
|---|---|---|---|
| 5,294,826 | 3/1994 | Marcantonio et al. | 257/659 |
| 5,341,979 | 8/1994 | Gupta | 228/111 |
| 5,367,765 | 11/1994 | Kusaka | 29/840 |
| 5,506,756 | 4/1996 | Haley | 361/789 |
| 5,532,512 | 7/1996 | Fillion et al. | 257/686 |
| 5,610,442 | 3/1997 | Schneider et al. | 257/787 |
| 5,724,230 | 3/1998 | Poetzinger | 257/712 |
| 5,786,635 | 7/1998 | Alcoe et al. | 257/779 |

FOREIGN PATENT DOCUMENTS

| | | | |
|---|---|---|---|
| 60-137041 | 7/1985 | Japan | 257/796 |
| 61-166051 | 7/1986 | Japan | 257/796 |
| 6-132425 | 5/1994 | Japan | 257/706 |

OTHER PUBLICATIONS

E. Jan Vardaman & R. Crowley, "Emerging Flip Chip Use —LCDs, Watches, and Computers Drive Demand", pp. 8–9; Suss Report, Q1–1995.

D. Gupta, "A Novel Active Area Bumped Flip Chip Technology for Convergent Heat Transfer from Gallium Arsenide Power Devices", IEEE Transactions on Components, Packaging and Manufacturing Technology; Party A., vol. 18, No. 1, Mar. 1995, pp. 82–86.

*Primary Examiner*—Mahshid Saadat
*Assistant Examiner*—Jhihan B. Clark

[57] ABSTRACT

To mount a semiconductor i.c. die on a support substrate the upper surface of the die is provided with electrically conductive bumps all of which are the same height. The bumps are provided on the ground connection pads on the upper surface of the die. The conductive pads on the die including the ground connection pads are connected to corresponding contacts on the upper surface of the substrate on which the die is mounted. Additionally, a thermally conductive, electrically conductive slug overlies the die and is mounted on and bonded to the bumps. The slug provides required heat removal from the die and also provides necessary ground connection to circuitry within the die.

20 Claims, 3 Drawing Sheets

CHIP MOUNTING SCHEME

FIELD OF THE INVENTION

This invention relates to the mounting of a semiconductor chip to a substrate.

BACKGROUND OF THE INVENTION

In the manufacture of semiconductor devices an important aspect is the production of i.c. (integrated circuit) packages by mounting semiconductor i.c. chips (dies) on support substrates such that there is good electrical and mechanical interconnection between the chips and the substrates. Among conventional techniques for mounting a chip to a substrate are wire bonding and flip chip.

In wire bonding, the chip is mounted face up on the support substrate and wire bonds are formed between bonding pads on the chip and corresponding contact pads on the substrate. In order to establish ground connection between ground points on the upper face of the chip and a ground plane in the substrate, it is necessary to form metal-plated through holes or vias extending through the thickness of the chip. The via process is low yield and renders the chips fragile and subject to breakage.

In the flip chip process, the chip is flipped face down and electrical contact pads including ground pads on the face down surface of the chip are bonded to corresponding pads on the upper surface of the substrate. Several different types of flip chip methodology are in use. One uses tin/lead solder bumps, another uses indium/lead alloy solder and yet another uses gold bumps. One main drawback of the flip chip technique is the requirement to position the chip very accurately on the substrate such that the pads on the chip are perfectly aligned with the pads on the substrate. Additionally, the resulting package often has poor thermal dissipation qualities.

SUMMARY OF THE INVENTION

It is an object of the present invention to provide a novel technique in which the above-identified disadvantages of the prior art are obviated or mitigated.

According to one aspect of the present invention, there is provided an integrated circuit package comprising: an integrated circuit die having an upper surface on which are provided a plurality of electrically conductive pads; a substrate having an upper surface on which are provided a plurality of electrically conductive contacts; the die being mounted on the upper surface of the substrate and being bonded thereto such that the contacts of the substrate are exposed; electrical connectors interconnecting the conductive pads on the die with respective ones of the contacts on the substrate; and a thermally conductive, electrically non-conductive slug mounted on and bonded to the upper surface of the die.

According to another aspect of the present invention, there is provided an integrated circuit package comprising: an integrated circuit die having an upper surface on which are provided a plurality of electrically conductive pads some of which are ground connection pads; a substrate having an upper surface on which are provided a plurality of electrically conductive contacts; the die being mounted on the upper surface of the substrate and being bonded thereto such that the contacts of the substrate are exposed; electrical connectors interconnecting the conductive pads on the die with respective ones of the contacts on the substrate; each of the ground connection pads having an electrically conductive bump projecting from the upper surface of the die, all of the bumps projecting substantially the same height above the upper surface; and a thermally conductive, electrically conductive slug overlying the upper surface of the die and being mounted on and bonded to the bumps.

According to a further aspect, there is provided an integrated circuit package comprising: an integrated circuit die having an upper surface on which are provided a plurality of electrically conductive pads some of which are ground connection pads; a substrate having an upper surface on which are provided a plurality of electrically conductive contacts; the die being mounted on the upper surface of the substrate and being bonded thereto such that the contacts of the substrate are exposed; electrical connectors interconnecting the conductive pads on the die with respective ones of the contacts on the substrate; and a thermally conductive, electrically conductive slug overlying the upper surface of the die, the slug having thereon a plurality of electrically conductive bumps projecting substantially the same distance from the lower surface of the slug, the slug being mounted on the die by virtue of bonding of the bumps to the ground connection pads.

According to yet another aspect, there is provided an integrated circuit package comprising: an integrated circuit die having an upper surface on which are provided a plurality of electrically conductive pads some of which are ground connection pads; a substrate having an upper surface on which are provided a plurality of electrically conductive contacts; the die being mounted on the upper surface of the substrate and being bonded thereto such that the contacts of the substrate are exposed; electrical connectors interconnecting the conductive pads on the die with respective ones of the contacts on the substrate; each of the ground connection pads having an electrically conductive bump projecting from the upper surface of the die, all of the bumps projecting substantially the same height above the upper surface; and a thermally conductive, electrically nonconductive slug overlying the upper surface of the die, the slug having on its lower surface a pattern of electrically conductive interconnects, the slug being mounted on the die by virtue of bonding of the bumps to portions of the interconnects.

According to still another aspect, there is provided an integrated circuit package comprising: an integrated circuit die having an upper surface on which are provided a plurality of electrically conductive pads some of which are ground connection pads; a substrate having an upper surface on which are provided a plurality of electrically conductive contacts; the die being mounted on the upper surface of the substrate and being bonded thereto such that the contacts of the substrate are exposed; electrical connectors interconnecting the conductive pads on the die with respective ones of the contacts on the substrate; and a thermally conductive, electrically non-conductive slug overlying the upper surface of the die, the slug having on its lower surface a pattern of electrically conductive interconnects and a plurality of electrically conductive bumps on the interconnects, projecting substantially the same distance from the lower surface of the slug, the slug being mounted on the die by virtue of bonding of the bumps to the ground connection pads.

BRIEF DESCRIPTION OF THE DRAWINGS

A preferred embodiment of this invention will now be described with reference to the attached drawings in which.

DETAILED DESCRIPTION OF THE PREFERRED EMBODIMENT

Figure 2:
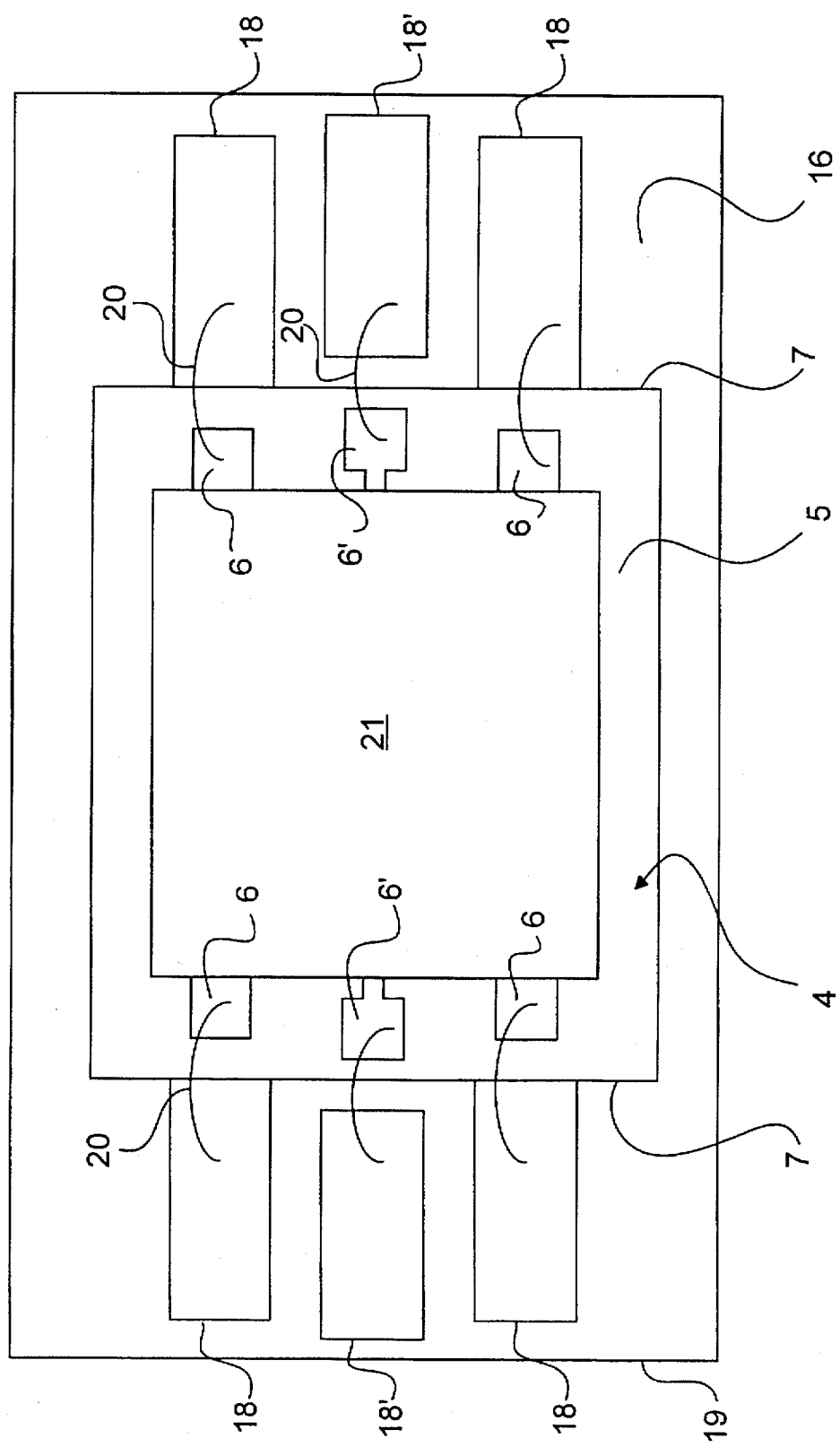
FIG. 2 is a top view of the chip package of FIG. 1.

A GaAs die 4, thinned to 100 microns, is constructed as a high power HBT (heterojunction bipolar transistor) amplifier consisting of several amplifier cells. The upper surface 5 of the die 4 is provided with a plurality of bond pads 6 and 6' disposed at spaced locations near two opposite edges 7 of the die as seen in FIGS. 2 and 3.

There are three bond pads 6, 6' along each edge 7, the four outer ones 6 being ground connection pads and the two inner ones 6' being signal line input and output connection pads. As seen in FIG. 3, the two ground connection pads 6 on one edge of the die 4 are respectively connected to the two ground connection pads 6 on the other edge of the die by way of ground interconnects 8 running straight across the die.

Each signal line connection pad 6' is connected to two active devices (amplifier cells) 9 located generally centrally of the die edges by means of interconnects 10. The amplifier cells 9 are also in contact respectively with two ground connection pads 11 which respectively join the interconnects 8. The amplifier cells 9 are provided with a third ground connection pad 12 which extends between the amplifier cells 9 but does not engage the interconnects 8.

Figure 1:
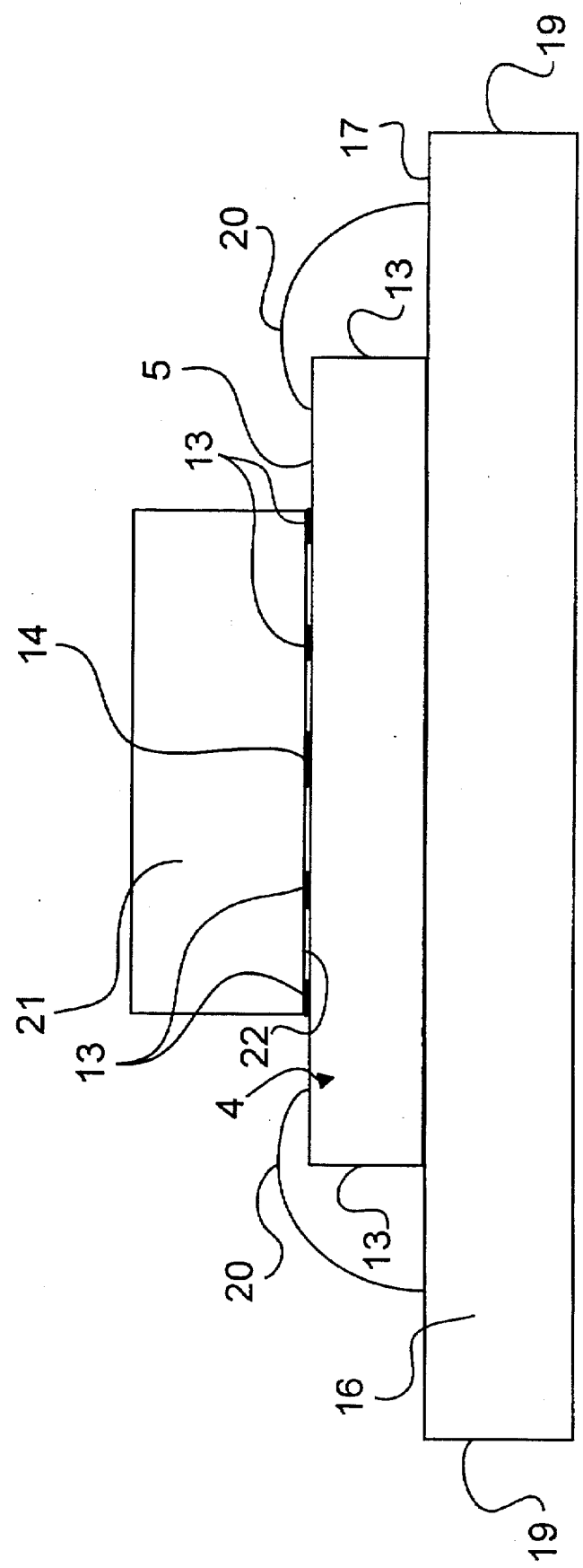
FIG. 1 is a side view of a chip package constructed according to the present invention.
Figure 3:
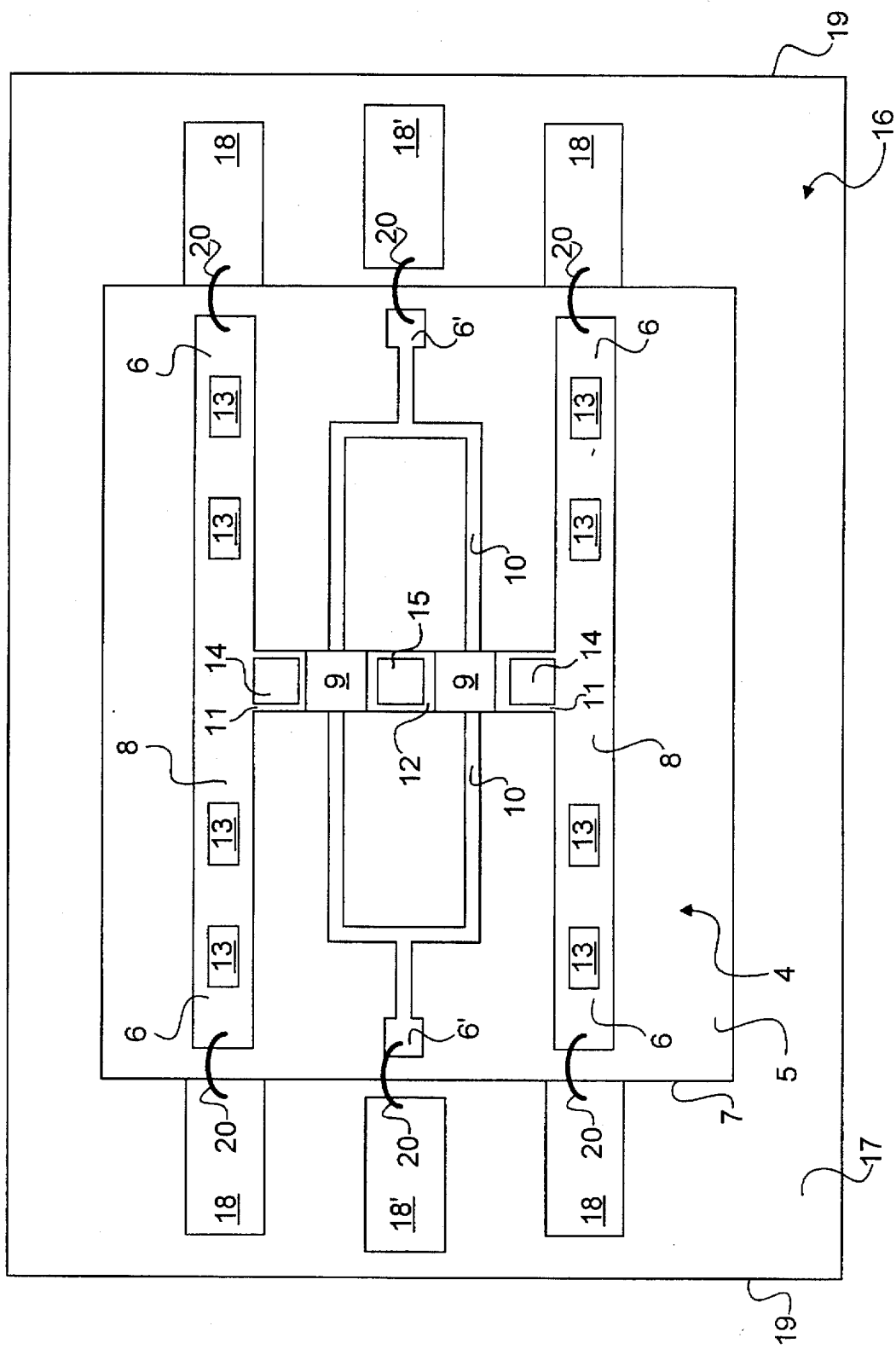
FIG. 3 is a top view of the chip package of FIG. 1 but with the upper thermal slug removed.

It should be noted that FIG. 3 illustrates one example of the circuitry embodied in the die and illustrates a simplified version of the layout. In particular, it should be noted that no supply (bias) connections are shown in FIGS. 1 to 3 but it should be understood that, in practice, the substrate would have supply contact pads which would have to be interconnected to the transistor cells 9. This would be done in a manner similar to that used for the signal contact pads 6'. That is to say, the die would have further contact pads connected by a wire bonds respectively to the supply contact pads and those further contact pads would be connected by patterned interconnects to the transistors 9.

It should be understood that the invention is in no way limited to the specific circuitry shown. However, it should be noted that, in general, in addition to the ground connection pads along two opposite edges of the die, the die will be provided on its upper surface 5 with one or more ground connection pads remote from the edges of the die.

The die 4 is provided on its upper surface 5 with a plurality of gold plated bumps which are 20 microns high. In particular, four bumps 13 are provided at spaced locations on each ground interconnect 8, a bump 14 is provided on each ground connection pad 11 and a bump 15 is provided on ground connection pad 12. No bumps are provided on or in communication with the signal bond pads 6' or any supply pad (not shown). It should be noted that the height of the bumps is not critical and could by way of example fall within the range of 5–50 microns. All the bumps should, of course, be the same height. Also, it will be noted that, while bumps 13 are rectangular in section and bumps 14 and 15 are square, the shape of the bumps is unimportant and they could, for example, be spherical.

The die 4 is eutectically bonded to an aluminum nitride substrate 16 which has a greater surface area than the die. The upper surface 17 of the substrate 16 is provided with three contact pads 18, 18' disposed adjacent each opposite edge 19 of the substrate. The contact pads 18 are respectively aligned with the bond pads 6 and the contact pads 18' are respectively aligned with the bond pads 6'. Wires 20 respectively extend between bond pads 6 and contact pads 18 and between bond pads 6' and contact pads 18' and are bonded thereto to establish an electrical connection between a bond pad and the associated contact pad.

A copper/tungsten thermal slug 21 having a uniform gold/tin layer deposited on its undersurface 22 is attached to the die 4 by a thermal reflow step which causes eutectic bonding of the slug to the bumps 13, 14 and 15.

It is noted that ground connection to the amplifier ground connection pad 12 is made through the thermal slug 21. Specifically, the ground contact pads 18 on the substrate are connected via the wire bonds 20 to the ground bond pads 6 and the ground connection continues through the bumps 13, through the thermal slug 21 and through the bump 15 to the ground connection pads 12. Ground connections to ground connection pads 11 are made both directly via the interconnects 8 and also indirectly via bumps 13, slug 21 and bumps 14.

It is noted that the positioning of the slug 21 is easy as no aligning is necessary other than ensuring the slug does not short the wire bonds.

The use of the bumps and thermal slug is particularly useful where the die forms a high power GaAs HBT as described. Firstly, it enables a large amount of heat to be removed from the GaAs which is a relatively poor thermal conductor. Secondly, it ensures that there is a reasonably uniform temperature maintained across the die which avoids the phenomenon known as "current hogging" or "current crunch" in which thermal runaway is achieved by the hottest cell.

It should be noted, however, that the GaAs HBT amplifier chip is simply one application of the invention. The invention can also be used with effect with dies of other semiconductor material such as Si and the substrate could be made of material other than aluminum nitride, e.g. alumina, beryllia, diamond or copper/tungsten.

While wire bonds were used in the embodiment described, it should be understood that the wire bonds could be replaced with ribbon or tab bonds as is well known in the art.

The bumps are, as described above, preferably provided on the chips for example using a screen printing or photolithographic technique. Alternatively, they could be provided on the thermal slug but this would make assembly more difficult in view of the requirement to align the bumps with the ground pads on the die.

Although not specifically described, the top of the thermal slug could be contacted for improved heat removal either by a package lid using a suitable lower temperature eutectic such as lead/tin or by a suitable heat sink to a cooling device.

Although the method of bonding the thermal slug to the die is by a eutectic bond, this could also be achieved by thermal compression or thermosonically.

The use of an electrically conductive thermal slug as described not only provides the required heat removal from the die but also provides the necessary ground connection to the circuitry within the die. It is also envisaged that an electrically non-conductive thermal slug could be used in cases where there were no ground connections to be made to interior parts of the die or any such ground connections are established in other ways. In such a case, it would not be necessary to provide bumps on the die and the slug, made for example of diamond, would be directly on and be bonded to the upper surface of the die.

Instead of an all metal ground plane slug as described with reference to FIGS. 1 to 3 or an all electrically insulating material slug as referred to in the preceding paragraph, it is envisaged that the invention could be extended to the use of an electrically insulating slug on which patterned electrically conductive interconnects are formed on the undersurface which would permit not only connections to ground but all or most of the internal connections to the chip to be made. In this way the patterned interconnects normally made on the chip could instead be made on the slug. Of course, bumps would have to be positioned not only on the ground pads on the die but also on the signal and supply pads. One drawback is that greater positional accuracy would be required. Again, the bumps could be provided on the slug instead of the chip.

It should be appreciated that the type of interconnect technique employed by the substrate is not material to the invention and it may, for example, be constructed as a microstrip, coplanar waveguide or other interconnect.

I claim:

1. An integrated circuit package comprising:
    an integrated circuit die having an upper surface on which are provided a plurality of electrically conductive pads some of which are ground connection pads;
    a substrate having an upper surface on which are provided a plurality of electrically conductive contacts;
    the die being mounted on the upper surface of the substrate and being bonded thereto such that the contacts of the substrate are exposed;
    electrical connectors interconnecting the conductive pads on the die with respective ones of the contacts on the substrate;
    each of the ground connection pads having an electrically conductive bump projecting from the upper surface of the die, all of the bumps projecting substantially the same height above the upper surface; and
    a thermally conductive, electrically conductive slug overlying the upper surface of the die and being mounted on and bonded to the bumps.

2. An integrated circuit package according to claim 1, wherein some of the ground connection pads are located proximate an edge of the die and at least one ground connection pad is located remote from edges of the die for providing a ground connection to a part of the integrated circuit within the die.

3. An integrated circuit package according to claim 1, wherein the bumps are of a height in the range 5–50 microns.

4. An integrated circuit package according to claim 1, wherein the slug is bonded to the die by means of a eutectic bond.

5. An integrated circuit package according to claim 1, wherein the slug is bonded to the die by means of a thermal compression bond.

6. An integrated circuit package according to claim 1, wherein the slug is bonded to the die by means of a thermosonic bond.

7. An integrated circuit package according to claim 1, wherein the slug is in thermal contact with a heat sink.

8. An integrated circuit package according to claim 1, wherein the slug is made of copper/tungsten with a gold/tin layer on a surface which is bonded to the die.

9. An integrated circuit package according to claim 2, wherein at least some of the ground connection pads located proximate an edge are interconnected by a metallized pattern of interconnects and wherein the at least one ground connection pad located remote from edges of the die is interconnected to the other ground connection pads only through the slug.

10. An integrated circuit package according to claim 2, wherein the bumps are of a height in the range 5–50 microns.

11. An integrated circuit package according to claim 9, wherein the die is made of GaAs.

12. An integrated circuit package according to claim 11, wherein the die has formed therein a high power HBT amplifier and wherein the at least one ground connection pad located remote from edges of the die serves to connect the amplifier to ground.

13. An integrated circuit package according to claim 12, wherein the bumps are of a height in the range 5–50 microns.

14. An integrated circuit package according to claim 12, wherein the slug is made of copper/tungsten with a gold/tin layer on a surface which is bonded to the die.

15. An integrated circuit package according to claim 10, wherein the bumps are substantially 20 microns in height.

16. An integrated circuit package according to claim 3, wherein the bumps are substantially 20 microns in height.

17. An integrated circuit package according to claim 13, wherein the bumps are substantially 20 microns in height.

18. An integrated circuit package comprising:
    an integrated circuit die having an upper surface on which are provided a plurality of electrically conductive pads some of which are ground connection pads;
    a substrate having an upper surface on which are provided a plurality of electrically conductive contacts;
    the die being mounted on the upper surface of the substrate and being bonded thereto such that the contacts of the substrate are exposed;
    electrical connectors interconnecting the conductive pads on the die with respective ones of the contacts on the substrate; and
    a thermally conductive, electrically conductive slug overlying the upper surface of the die, the slug having thereon a plurality of electrically conductive bumps projecting substantially the same distance from the lower surface of the slug, the slug being mounted on the die by virtue of bonding of the bumps to the ground connection pads.

19. An integrated circuit package comprising:
    an integrated circuit die having an upper surface on which are provided a plurality of electrically conductive pads some of which are ground connection pads;
    a substrate having an upper surface on which are provided a plurality of electrically conductive contacts;
    the die being mounted on the upper surface of the substrate and being bonded-thereto such that the contacts of the substrate are exposed;
    electrical connectors interconnecting the conductive pads on the die with respective ones of the contacts on the substrate;
    each of the ground connection pads having an electrically conductive bump projecting from the upper surface of the die, all of the bumps projecting substantially the same height above the upper surface; and
    a thermally conductive, electrically non-conductive slug overlying the upper surface of the die, the slug having on its lower surface a pattern of electrically conductive interconnects, the slug being mounted on the die by virtue of bonding of the bumps to portions of the interconnects.

20. An integrated circuit package comprising:

an integrated circuit die having an upper surface on which are provided a plurality of electrically conductive pads some of which are ground connection pads;

a substrate having an upper surface on which are provided a plurality of electrically conductive contacts;

the die being mounted on the upper surface of the substrate and being bonded thereto such that the contacts of the substrate are exposed;

electrical connectors interconnecting the conductive pads on the die with respective ones of the contacts on the substrate; and a thermally conductive, electrically non-conductive slug overlying the upper surface of the die, the slug having on its lower surface a pattern of electrically conductive interconnects and a plurality of electrically conductive bumps on the interconnects projecting substantially the same distance from the lower surface of the slug, the slug being mounted on the die by virtue of bonding of the bumps to the ground connection pads.

* * * * *